United States Patent
Lin et al.

(10) Patent No.: US 9,728,597 B2
(45) Date of Patent: Aug. 8, 2017

(54) METAL-INSULATOR-METAL STRUCTURE AND METHOD FOR FORMING THE SAME

(71) Applicant: Taiwan Semiconductor Manufacturing Co., Ltd, Hsin-Chu (TW)

(72) Inventors: Hsing-Lien Lin, Hsinchu (TW); Chia-Shiung Tsai, Hsinchu (TW); Cheng-Yuan Tsai, Chu-Pei (TW); Huey-Chi Chu, Hsinchu (TW); Hai-Dang Trinh, Hsinchu (TW); Wen-Chuan Chiang, Hsinchu (TW); Wei-Min Tseng, New Taipei (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 14/800,144

(22) Filed: Jul. 15, 2015

(65) Prior Publication Data
US 2016/0163781 A1 Jun. 9, 2016

Related U.S. Application Data

(60) Provisional application No. 62/087,648, filed on Dec. 4, 2014.

(51) Int. Cl.
*H01L 49/02* (2006.01)
*H01L 21/02* (2006.01)
*H01L 23/522* (2006.01)

(52) U.S. Cl.
CPC .......... *H01L 28/60* (2013.01); *H01L 21/0226* (2013.01); *H01L 23/5223* (2013.01)

(58) Field of Classification Search
None
See application file for complete search history.

(56) References Cited

U.S. PATENT DOCUMENTS

| | | | |
|---|---|---|---|
| 7,164,203 B1 * | 1/2007 | Londergan | H01L 21/28562 257/751 |
| 7,491,619 B2 * | 2/2009 | Park | H01L 27/0805 438/387 |
| 7,662,693 B2 * | 2/2010 | Bhattacharyya | H01G 4/08 257/411 |
| 2011/0309420 A1 | 12/2011 | Chang et al. | |
| 2013/0307118 A1 | 11/2013 | Tu | |
| 2014/0021584 A1 | 1/2014 | Tu et al. | |
| 2014/0145307 A1 | 5/2014 | Chen et al. | |
| 2016/0133691 A1 * | 5/2016 | Phatak | H01L 28/75 257/532 |

* cited by examiner

*Primary Examiner* — Michelle Mandala
(74) *Attorney, Agent, or Firm* — Birch, Stewart, Kolasch & Birch, LLP

(57) ABSTRACT

A semiconductor structure and a method for forming the same are provided. The method for manufacturing a semiconductor structure includes forming a bottom electrode layer over a substrate and forming a first passivation layer over the bottom electrode layer by a first atomic layer deposition process. The method for manufacturing a semiconductor structure further includes forming a dielectric layer over the first passivation layer by a second atomic layer deposition process and forming a second passivation layer over the dielectric layer by a third atomic layer deposition process. The method for manufacturing a semiconductor structure further includes forming a top electrode layer over the second passivation layer.

20 Claims, 6 Drawing Sheets

METAL-INSULATOR-METAL STRUCTURE AND METHOD FOR FORMING THE SAME

PRIORITY CLAIM AND CROSS-REFERENCE

This Application claims the benefit of U.S. Provisional Application No. 62/087,648, filed on Dec. 4, 2014, and entitled "A Novel Method to Reduce Leakage Tailing and Uniformity for Ultra HD Metal-Insulator-Metal Devices", the entirety of which is incorporated by reference herein.

BACKGROUND

Semiconductor integrated circuit devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

Over the past several decades, the semiconductor integrated circuit industry has experienced rapid growth. Technological advances in semiconductor materials and design have produced increasingly smaller and more complex circuits. These material and design advances have been made possible as the technologies related to processing and manufacturing have also undergone technical advances.

Many of the technological advances in semiconductors have occurred in the field of memory devices, and some of these involve capacitors. A metal-insulator-metal (MIM) capacitor is one of the most widely used capacitors in integrated circuits. However, although existing processes for manufacturing a metal-insulator-metal (MIM) structure have generally been adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
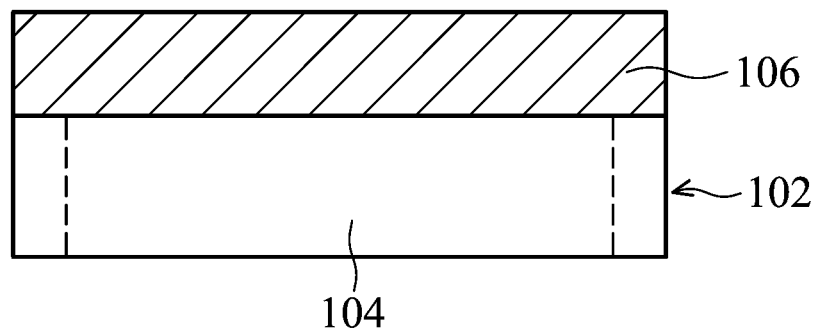
FIGS. 1A to 1H are cross-sectional representations of various stages of forming a metal-insulator-metal structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of semiconductor structures and methods for forming the same are provided. The semiconductor structure may include a metal-insulator-metal structure. The metal-insulator-metal structure includes a top electrode layer, a dielectric layer, and a bottom electrode layer. In addition, passivation layers are formed between the top electrode layer and the dielectric layer and between the dielectric layer and the bottom electrode layer to improve the yield of forming the semiconductor structure. The passivation layers may be amorphous layers formed by atomic layer deposition processes.

FIGS. 1A to 1H are cross-sectional representations of various stages of forming a metal-insulator-metal structure 100 in accordance with some embodiments. As shown in FIG. 1A, a substrate 102 is provided in accordance with some embodiments. Substrate 102 may be a semiconductor wafer such as a silicon wafer. Alternatively or additionally, substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In addition, substrate 102 may include structures such as doped regions, interlayer dielectric (ILD) layers, conductive features, and/or isolation structures. Furthermore, substrate 102 may further include single or multiple material layers to be patterned. For example, the material layers may include a silicon layer, a dielectric layer, and/or a doped poly-silicon layer.

In some embodiments, substrate 102 includes a device region 104, as shown in FIG. 1A. Device region 104 may include active components or circuits, such as conductive features, implantation regions, resistors, capacitors, and other semiconductor elements. In some embodiments, device region 104 includes a transistor and an interconnect structure.

A bottom electrode layer 106 is formed over substrate 102, as shown in FIG. 1A in accordance with some embodiments. In some embodiments, bottom electrode layer 106 is made of TiN, TaN, Ti, Ta, gold (Au), platinum (Pt), ruthenium (Ru), iridium (Ir), titanium (Ti), aluminum (Al), copper (Cu), tantalum (Ta), tungsten (W), iridium-tantalum alloy (IrTa), indium-tin oxide (ITO), or combinations thereof.

In some embodiments, bottom electrode layer 106 is a crystalline layer formed by a physical vapor deposition (PVD) process. When bottom electrode layer 106 is formed by physical vapor deposition process, the cost of forming bottom electrode layer 106 can be reduced. However, the roughness of the resulting bottom electrode layer 106 may be relatively high.

In some embodiments, bottom electrode layer 106 has a thickness in a range from about 400 Å to about 800 Å. Bottom electrode layer 106 should be thick enough or the resistance may be too high.

Figure 1B:
Figure 1B:
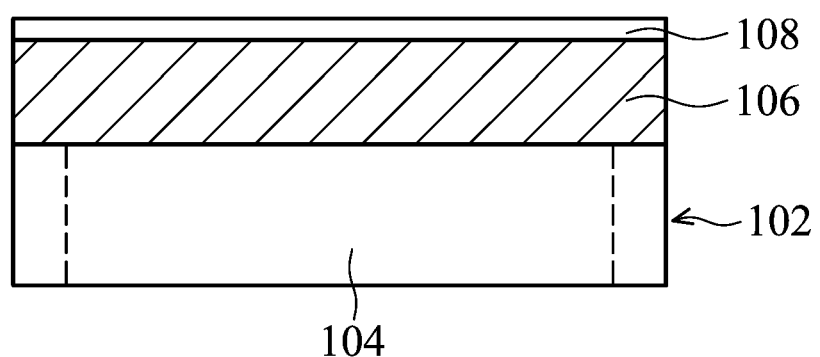

After bottom electrode layer 106 is formed, a first passivation layer 108 is formed over bottom electrode layer 106, as shown in FIG. 1B in accordance with some embodiments. In some embodiments, first passivation layer 108 is made of TiN or TaN. In some embodiments, first passivation layer 108 and bottom electrode layer 106 are made of the same material but with a different molecular arrangement. In some embodiments, bottom electrode layer 106 is a crystalline layer, and first passivation layer 108 is an amorphous layer.

In some embodiments, first passivation layer 108 is an amorphous layer formed by a first atomic layer deposition (ALD) process 110. In some embodiments, first atomic layer deposition process 110 is a plasma-enhanced atomic layer deposition (PEALD) process. When first atomic layer deposition process 110 is performed, first passivation layer 108 is formed by stacking the monolayer molecular over one another. Therefore, the resulting first passivation layer 108 can be an amorphous layer without having column-shape crystalline structures. In addition, first passivation layer 108 can have a smooth top surface.

In some embodiments, first atomic layer deposition process 110 includes using $H_2/N_2$ plasma. The $H_2/N_2$ plasma may be used to treat the top surface of bottom electrode layer 106 during first atomic layer deposition process 110. For example, the oxide layer formed over bottom electrode layer 106 resulting from reacting with the moisture and/or oxygen in the environment (e.g. air) while being transferred may be treated and removed by the $H_2/N_2$ plasma.

In some embodiments, first atomic layer deposition process 110 includes using $TiCl_4$ as a precursor. In some embodiments, first atomic layer deposition process 110 is performed under a pressure in a range from about 2 Torr to about 7 Torr.

In some embodiments, first passivation layer 108 has a thickness in a range from about 15 Å to about 50 Å. The formation of first passivation layer 108 is configured to improve the interface between bottom electrode layer 106 and the dielectric layer formed afterwards. However, if first passivation layer 108 is too thick, some crystalline structures may be formed, resulting in undermining the performance of the resulting metal-insulator-metal structure 100. On the other hand, if first passivation layer 108 is too thin, the uniformity of the layer may be decreased and the risk of direct tunneling may increase.

As described above, bottom electrode layer 106 formed by a PVD process may have a rough top surface. Therefore, first atomic layer deposition process 110 is performed to form first passivation layer 108, which has a smooth top surface, such that the dielectric layer formed afterwards can have a better adhesion.

Figure 1C:

After first passivation layer 108 is formed, a dielectric layer 112 is formed over first passivation layer 108, as shown in FIG. 1C in accordance with some embodiments. In some embodiments, dielectric layer 112 is made of a high-k dielectric material. Examples of the high k dielectric material may include, but are not limited to, HfO, AlO, ZrO, $Ta_2O_5$, HfTaO, ZeAlO, HfAlO, TaAlO, HfO/AlO/HfO, TaO/AlO/TaO, ZrO/AlO/ZrO, $ZrO_2$, $Al_2O_3$, $HfO_2$, HfSiO, HfSiON, HfTiO, HfZrO, or a combination thereof.

In some embodiments, dielectric layer 112 is formed by a second atomic layer deposition (ALD) process 114. In some embodiments, second atomic layer deposition process 114 is performed under a pressure in a range from about 2 Torr to about 7 Torr.

As described above, first passivation layer 108 is formed before dielectric layer 112 is formed. In addition, first passivation layer 108 has a smooth top surface. Therefore, when dielectric layer 112 is formed, it can have good adhesion with first passivation layer 108. Accordingly, even if dielectric layer 112 is relatively thin, it can still retain good reliability.

In some embodiments, dielectric layer 112 has a thickness in a range from about 40 Å to about 100 Å. The thickness of dielectric layer 112 may be adjusted according to the required capacitance of its application. For example, if a greater capacitance is required, a thicker dielectric layer 112 may be formed. Conversely, if a smaller capacitance is required, a thinner dielectric layer 112 may be formed.

Figure 1D:

After dielectric layer 112 is formed, a second passivation layer 116 is formed over dielectric layer 112, as shown in FIG. 1D in accordance with some embodiments. In some embodiments, second passivation layer 116 is made of TiN or TaN. In some embodiments, first passivation layer 108 and second passivation layer 116 are made of the same material. In some embodiments, second passivation layer 116 is an amorphous layer.

In some embodiments, second passivation layer 116 is an amorphous layer formed by a third atomic layer deposition (ALD) process 118. In some embodiments, third atomic layer deposition process 118 is a plasma-enhanced atomic layer deposition (PEALD) process. When third atomic layer deposition process 118 is performed, second passivation layer 116 is formed by stacking the molecular monolayers one on top of the other. Therefore, the resulting second passivation layer 116 can be an amorphous layer without having column-shape crystalline structures. In addition, second passivation layer 116 can have a smooth top surface.

In some embodiments, third atomic layer deposition process 118 includes using $H_2/N_2$ plasma. In some embodiments, third atomic layer deposition process 118 includes using $TiCl_4$ as a precursor. In some embodiments, third atomic layer deposition process 118 is performed under a pressure in a range from about 2 Torr to about 7 Torr.

In some embodiments, second passivation layer 116 has a thickness in a range from about 15 Å to about 50 Å. If second passivation layer 116 is too thick, some crystalline structure may be formed, resulting in undermining the performance of the metal-insulator-metal structure. On the other hand, if second passivation layer 116 is too thin, the uniformity of the layer may be decreased and the risk of direct tunneling may increase.

Figure 2:
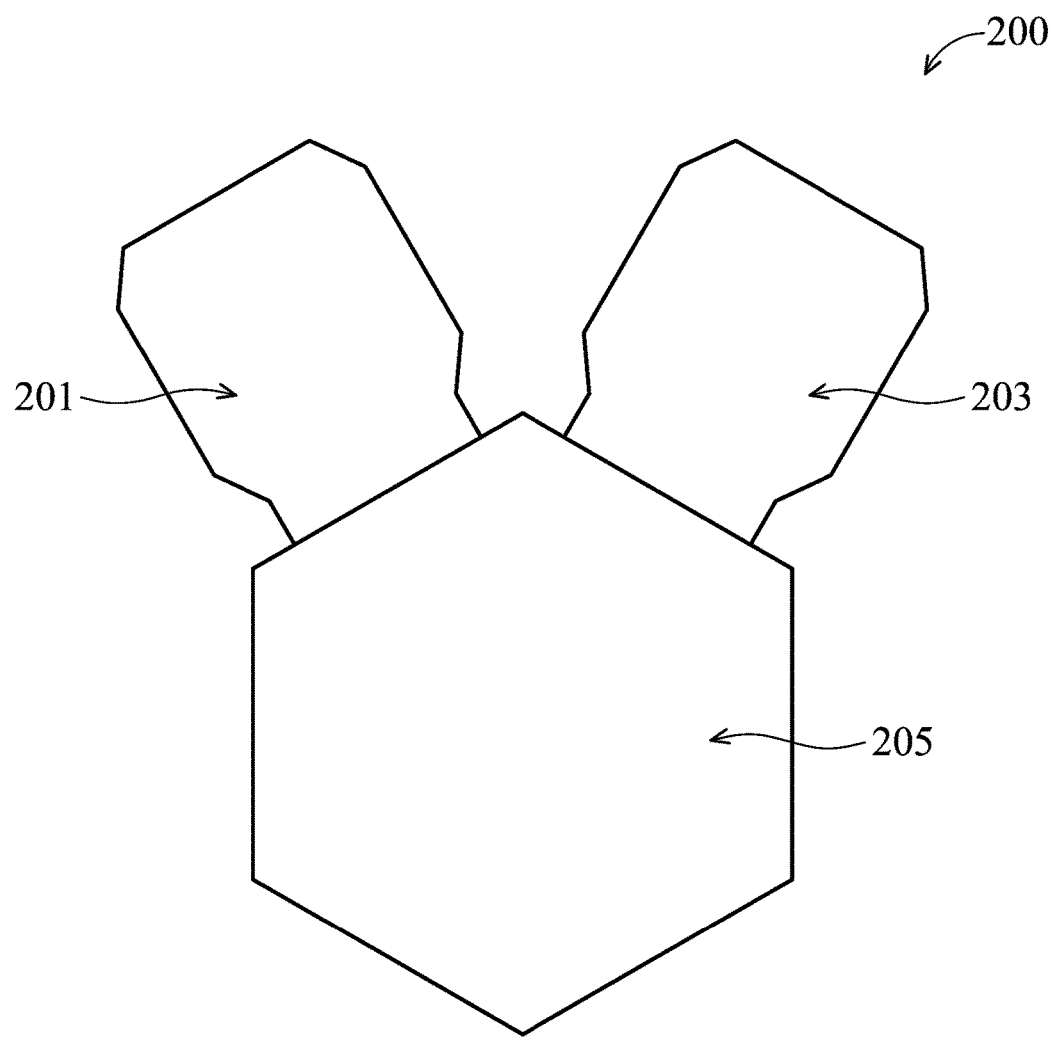
FIG. 2 shows an atomic layer deposition apparatus in which a first passivation layer, a dielectric layer, and a second passivation layer are formed in accordance with some embodiments.

In some embodiments, first atomic layer deposition process 110, second atomic layer deposition process 114, and third atomic layer deposition process 118 are performed in the same apparatus, such as an atomic layer deposition apparatus. FIG. 2 shows an atomic layer deposition apparatus 200 in which first passivation layer 108, dielectric layer 112, and second passivation layer 116 are formed in accordance with some embodiments.

In some embodiments, atomic layer deposition apparatus 200 includes a first deposition chamber 201, a second deposition chamber 203, and a transferring chamber 205. In some embodiments, first atomic layer deposition process 110 and third atomic layer deposition process 118 are performed in first deposition chamber 201 of atomic layer deposition apparatus 200, and second atomic layer deposition process 114 is performed in second deposition chamber 203 of atomic layer deposition apparatus 200.

More specifically, in some embodiments, after bottom electrode layer 106 is formed, substrate 102 is transferred to first deposition chamber 201 for forming first passivation layer 108. After first passivation layer 108 is formed over bottom electrode layer 106, substrate 102 is transferred to second deposition chamber 203 through transferring chamber 205 to form dielectric layer 112. After dielectric layer 112 is formed, substrate 102 is transferred back to first deposition chamber 201 through transferring chamber 205 to form second passivation layer 116.

Substrate 102 is not removed from atomic layer deposition apparatus 200 during the formation of first passivation layer 108, dielectric layer 112, and second passivation layer 116. In addition, atomic layer deposition apparatus 200 is operated under vacuum or relatively low pressure, so that the resulting material layers will not be damaged (e.g. oxidized) by moisture or oxygen in the air. Accordingly, the top surface of the resulting material layers, such as first passivation layer 108, dielectric layer 112, and second passivation layer 116, will not be damaged or oxidized during a transfer between two deposition processes.

It should be noted that atomic layer deposition apparatus 200 shown in FIG. 2 has been simplified for better understanding the disclosure. That is, atomic layer deposition apparatus 200 may further include additional units not shown in FIG. 2, and the scope of the disclosure is not intended to be limited.

Figure 1E:
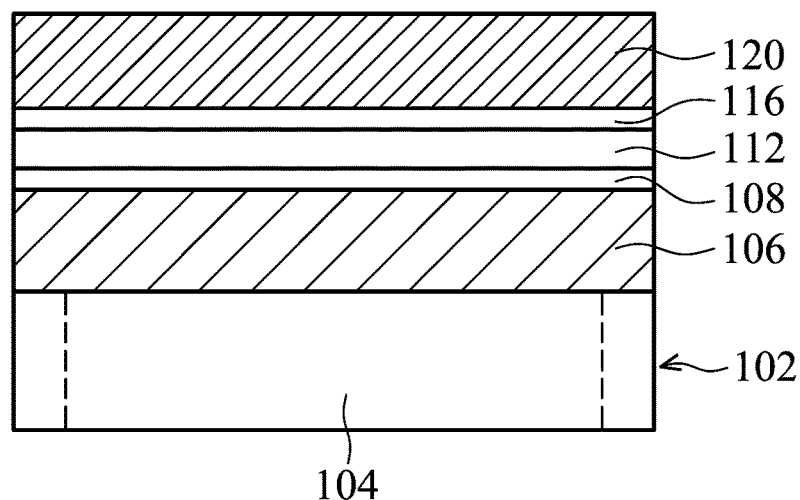

After second passivation layer 116 is formed, a top electrode layer 120 is formed over second passivation layer 116, as shown in FIG. 1E in accordance with some embodiments. In some embodiments, top electrode layer 120 is made of TiN, TaN, Ti, Ta, gold (Au), platinum (Pt), ruthenium (Ru), iridium (Ir), titanium (Ti), aluminum (Al), copper (Cu), tantalum (Ta), tungsten (W), iridium-tantalum alloy (IrTa), indium-tin oxide (ITO), or combinations thereof.

In some embodiments, top electrode layer 120 is a crystalline layer formed by a physical vapor deposition (PVD) process. When top electrode layer 120 is formed by physical vapor deposition process, the cost of forming top electrode layer 120 can be reduced. However, the roughness of the resulting top electrode layer 120 may be relatively high.

In some embodiments, top electrode layer 120 has a thickness in a range from about 400 Å to about 800 Å. Top electrode layer 120 should be thick enough or the resistance may be too high. In some embodiments, second passivation layer 116 and top electrode layer 120 are made of the same material but with a different molecular arrangement. In some embodiments, top electrode layer 120 is a crystalline layer, and second passivation layer 116 is an amorphous layer.

As described previously, first passivation layer 108 and second passivation layer 116 are formed to improve the adhesion of dielectric layer 112. In first passivation layer 108 and second passivation layer 116 are not formed, dielectric layer 112 will be in direct contact with bottom electrode layer 108 and top electrode layer 120. In this case, an interfacial layer, such as an oxide layer, may be formed at the interfaces between bottom electrode layer 106 and dielectric layer 112 and between dielectric layer 112 and top electrode layer 120, due to the moisture and oxygen in the environment during the transfer of substrate 102. Since the interfacial layer may be made of a low-k material, which may result in electron trapping, the capacitance of the resulting metal-insulator-metal structure may be undermined.

Accordingly, first passivation layer 108 and second passivation layer 116 are formed to prevent the formation of the interfacial layer at the interface between dielectric layer 112 and the layers formed below and above it. Since first passivation layer 108 and second passivation layer 116 are formed in the same atomic layer deposition apparatus 200, the interfacial layer will not be formed. In addition, since first passivation layer 108 and second passivation layer 116 are amorphous layers with smooth top surfaces, the adhesion of dielectric layer 112 can be improved.

Figure 1F:
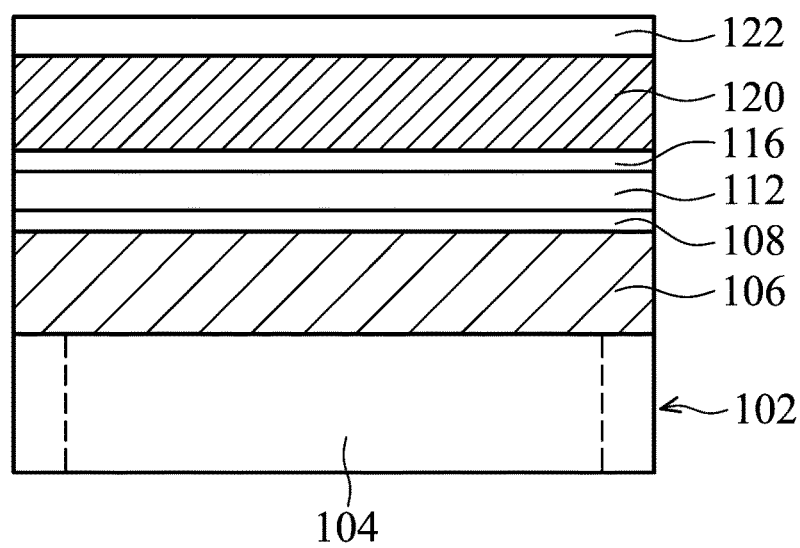

After top electrode layer 120 is formed, a hard mask layer 122 is formed over top electrode layer 120, as shown in FIG. 1F in accordance with some embodiments. In some embodiments, hard mask layer 122 is made of silicon oxide ($SiO_2$), silicon nitride (SiN), silicon oxynitride (SiON), silicon carbide (SiC), silicon oxycarbide (SiOC), or a combination thereof. Hard mask layer 122 may be formed by performing a low-pressure chemical vapor deposition (LPCVD) process or a plasma enhanced chemical vapor deposition (PECVD) process, although other deposition processes may also be used in some other embodiments.

Figure 1G:
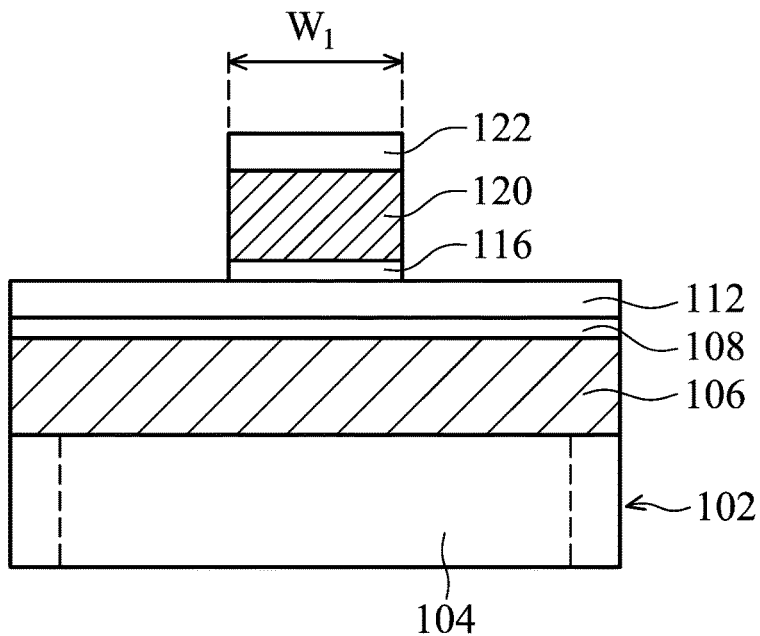

Next, hard mask layer 122, top electrode layer 120, and second passivation layer 116 are patterned, as shown in FIG. 1G in accordance with some embodiments. Hard mask layer 122, top electrode layer 120, and second passivation layer 116 may be patterned by forming a photoresist layer, etching hard mask layer 122, top electrode layer 120, and second passivation layer 116 through the photoresist layer, and removing the photoresist layer. After hard mask layer 122, top electrode layer 120, and second passivation layer 116 are patterned, hard mask layer 122, top electrode layer 120, and second passivation layer 116 have the same width $W_1$ in accordance with some embodiments.

Figure 1H:
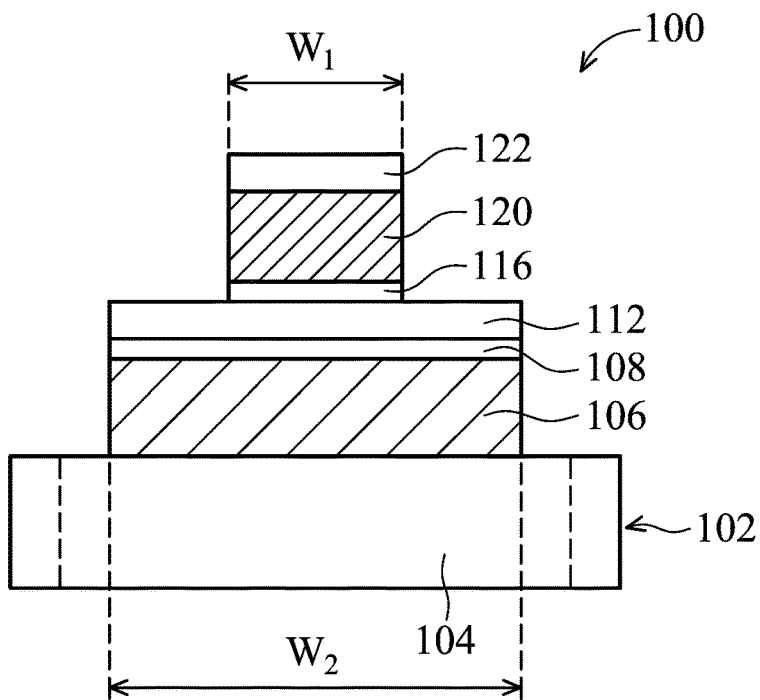

After hard mask layer 122, top electrode layer 120, and second passivation layer 116 are patterned, dielectric layer 112, first passivation layer 108, and bottom electrode layer 106 are patterned, as shown in FIG. 1H in accordance with some embodiments. Dielectric layer 112, first passivation layer 108, and bottom electrode layer 106 may be patterned by forming a photoresist layer, etching dielectric layer 112, first passivation layer 108, and bottom electrode layer 106 through the photoresist layer, and removing the photoresist layer. After dielectric layer 112, first passivation layer 108, and bottom electrode layer 106 are patterned, dielectric layer 112, first passivation layer 108, and bottom electrode layer 106 have the same width $W_2$ in accordance with some embodiments. In some embodiments, a first conductive structure is formed on top electrode layer 120 and a second conductive structure is formed on the portion of bottom electrode layer 106 which is not covered by top electrode layer 120. Therefore, width $W_2$ is greater than width $W_1$ in accordance with some embodiments.

Figure 3:
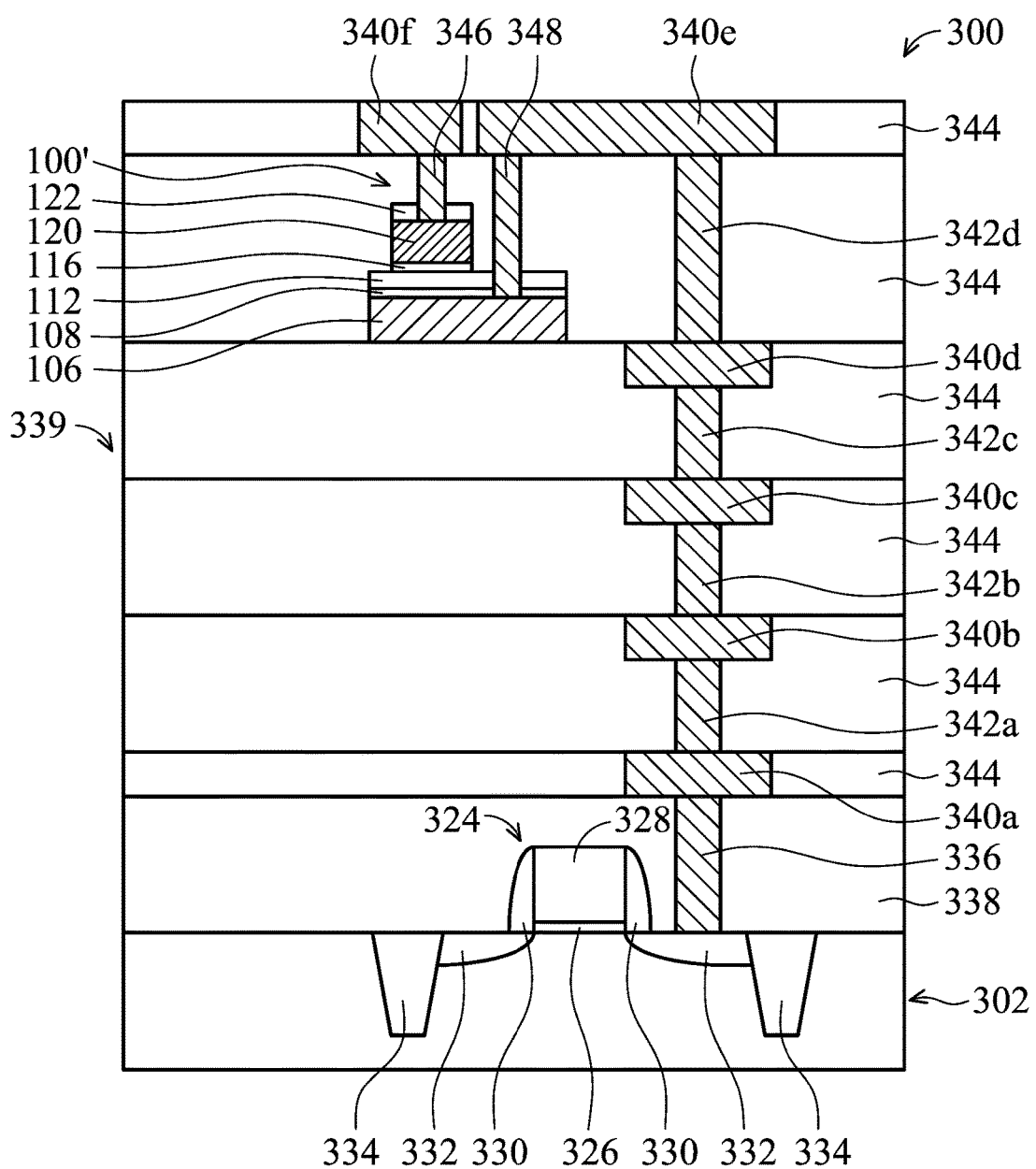
FIG. 3 is a cross-sectional representation of a semiconductor structure in accordance with some embodiments.

FIG. 3 is a cross-sectional representation of a semiconductor structure 300 in accordance with some embodiments. Semiconductor structure 300 includes a metal-insulator-metal structure 100' similar to, or the same as, metal-insulator-metal structure 100 shown in FIG. 1H and described previously.

More specifically, semiconductor structure 300 includes a substrate 302, and a transistor structure 324 formed over substrate 302 in accordance with some embodiments. Materials and method used to form substrate 302 may be similar to those used to form substrate 102 described above and are not repeated herein.

In some embodiments, transistor structure 324 includes a gate dielectric layer 326, a gate structure 328 formed over gate dielectric layer 326, and spacers 330 formed on the sidewalls of gate structure 328. In addition, source/drain structures 332 are formed in substrate 102 adjacent to transistor structure 324 in accordance with some embodiments. Furthermore, shallow trench isolation structures 334 are formed in substrate 102 to separate various devices.

In some embodiments, gate dielectric layer 326 is made of is made of high k dielectric materials. Examples of the high k dielectric material may include, but are not limited to, hafnium oxide (HfO$_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), metal oxides, metal nitrides, metal silicates, transition metal oxides, transition metal nitrides, transition metal silicates, oxynitrides of metals, metal aluminates, zirconium silicate, zirconium aluminate, zirconium oxide, titanium oxide, aluminum oxide, or hafnium dioxide-alumina (HfO$_2$—Al$_2$O$_3$) alloy.

In some embodiments, gate structure 328 is made of a conductive material, such as aluminum, copper, tungsten, titanium, tantalum, titanium nitride, tantalum nitride, nickel silicide, cobalt silicide, TaC, TaSiN, TaCN, TiAl, TiAlN, or other applicable materials. In some embodiments, gate structure 328 is made of polysilicon.

In some embodiments, spacers 330 are made of silicon nitride, silicon oxide, silicon oxynitride, silicon carbide, or other applicable dielectric materials. Spacers 120 may include a single layer or multiple layers.

In some embodiments, source/drain structures 332 are formed by using an implantation process or an epitaxial (epi) process. In some embodiments, source/drain structures 332 include Ge, SiGe, InAs, InGaAs, InSb, GaAs, GaSb, InAlP, InP, or the like.

In some embodiments, shallow trench isolation structures 334 are made of silicon oxide, silicon nitride, silicon oxynitride, fluoride-doped silicate glass (FSG), or other low-K dielectric materials. Shallow trench isolation structures 334 may be formed by using a high-density-plasma (HDP) CVD process, although other deposition processes may be used in other embodiments.

After transistor structure 324 is formed, a contact 336 is formed through an inter-layer dielectric layer 338 over source/drain structures 332. In some embodiments, contact 336 is made of a conductive material, such as aluminum (Al), copper (Cu), tungsten (W), titanium (Ti), tantalum (Ta), titanium nitride (TiN), tantalum nitride (TaN), nickel silicide (NiS), cobalt silicide (CoSi), tantalum carbide (TaC), tantalum silicide nitride (TaSiN), tantalum carbide nitride (TaCN), titanium aluminide (TiAl), titanium aluminide nitride (TiAlN), other applicable conductive materials, or a combination thereof.

Inter-layer dielectric layer 338 may include multilayers made of multiple dielectric materials, such as silicon oxide, silicon nitride, silicon oxynitride, phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide.

After contact 336 is formed, an interconnect structure 339 is formed over inter-layer dielectric layer 338, as shown in FIG. 3 in accordance with some embodiments. In some embodiments, interconnect structure 339 includes metal lines 340a to 340f and vias 342a to 342d formed in inter-metal dielectric layers 344.

In some embodiments, metal lines 340a to 340f are made of highly-conductive metal, low-resistive metal, elemental metal, transition metal, or the like. Examples of conductive materials used to form metal lines 340a to 340f may include, but are not limited to, copper (Cu), aluminum (Al), tungsten (W), titanium (Ti), gold (Au), cobalt (Co), or tantalum (Ta). In addition, vias 342a to 342d may also be made of the conductive materials described above.

In some embodiments, inter-metal dielectric layers 344 include multilayers made of multiple dielectric materials, such as a low dielectric constant or an extreme low dielectric constant (ELK) material. Examples of the dielectric materials may include, but are not limited to, oxide, SiO$_2$, borophosphosilicate glass (BPSG), spin-on glass (SOG), undoped silicate glass (USG), fluorinated silicate glass (FSG), or high-density plasma (HDP) oxide. Inter-metal dielectric layers 344 may be formed by any applicable deposition process, such as CVD, and an chemical mechanical polishing (CMP) process may be performed after the deposition process.

It should be noted that the metal lines and vias shown in FIG. 3 are merely examples for better understanding the concept of the disclosure. For example, the numbers of metal lines and via and the connection between them may be varied according to their application, and the scope of the disclosure is not intended to be limited.

Metal-insulator-metal structure 100' is formed in inter-metal dielectric layers 344, as shown in FIG. 3 in accordance with some embodiments. In some embodiments, metal-insulator-metal structure 100' includes bottom electrode layer 106, first passivation layer 108 formed on bottom electrode layer 106, dielectric layer 112 formed on first passivation layer 108, second passivation layer 116 formed on dielectric layer 112, top electrode layer 120 formed on second passivation layer 116, and hard mask layer 122 formed on top electrode layer 120. Methods and materials used to form metal-insulator-metal structure 100' are similar to, or the same as, those used to from metal-insulator-metal structure 100 shown in FIGS. 1A to 1H and described previously and are not repeated herein.

After metal-insulator-metal structure 100' is formed, a first conductive structure 346 is formed through hard mask layer 122 and inter-metal dielectric layers 344 to connect with top electrode layer 120, as shown in FIG. 3 in accordance with some embodiments. In addition, first conductive structure 346 is further connected to metal line 340f in accordance with some embodiments.

In some embodiments, first conductive structure 346 is made of a highly-conductive metal, low-resistive metal, elemental metal, transition metal, or the like. Examples of conductive materials used to form first conductive structure 346 may include, but are not limited to, copper (Cu), aluminum (Al), tungsten (W), titanium (Ti), gold (Au), cobalt (Co), or tantalum (Ta).

A second conductive structure 348 is formed through dielectric layer 112, first passivation layer 108, and inter-metal dielectric layers 344 to connect with bottom electrode layer 106, as shown in FIG. 3 in accordance with some embodiments. In addition, second conductive structure 348 is further connected to metal line 340e in accordance with some embodiments.

In some embodiments, second conductive structure 348 is made of a highly-conductive metal, low-resistive metal, elemental metal, transition metal, or the like. Examples of conductive materials used to form second conductive structure 348 may include, but are not limited to, copper (Cu), aluminum (Al), tungsten (W), titanium (Ti), gold (Au), cobalt (Co), or tantalum (Ta).

As shown in FIG. 3, metal-insulator-metal structure 100' is connected to source/drain structures 332 formed adjacent to transistor structure 324 through second conductive structure 348 and other metal lines and vias. Since metal-insulator-metal structure 100' includes first passivation layer 108 and second passivation layer 116 formed below and above dielectric layer 112 to prevent the formation of interfacial layer, such as oxide layer, the performance of metal-insulator-metal structure 100' is improved, and the performance of semiconductor structure 300 which includes metal-insulator-metal structure 100' is also improved.

As previously described, a bottom electrode layer and a top electrode layer may be formed by using PVD process. However, the resulting electrode layers may have rough surfaces. Therefore, if a dielectric layer is formed directly over the bottom electrode layer, the dielectric layer may have poor adhesion due to the defects at the interfaces. In addition, an interfacial layer, such as an oxide layer, may be formed at the interface between the bottom electrode layer and the dielectric layer and between the dielectric layer and the top electrode layer due to being exposed to moisture and oxygen during the transfer from the apparatus used to form one material layer (e.g. the bottom electrode layer) to the apparatus used to form another material layer (e.g. the dielectric layer). Therefore, the yield and performance of the metal-insulator-metal structure are undermined.

Accordingly, in accordance with some embodiments, first passivation layer 108 and second passivation layer 116 are formed. More specifically, bottom electrode layer 106 and top electrode layer 120 having crystalline structures are formed by using PVD processes, and first passivation layer 108 and second passivation layer 116 having amorphous structures are formed by first ALD process 110 and second ALD process 118 in accordance with some embodiments. Dielectric layer 112 is positioned between first passivation layer 108 and second passivation layer 116. Since first passivation layer 108 and second passivation layer 116 have smooth surfaces, the adhesion of dielectric layer 112 can be improved. Furthermore, since the adhesion of dielectric layer 112 is improved, the reliability can still be retained, even when dielectric layer 112 is relatively thin.

Furthermore, first ALD process 110, second ALD process 114, and third ALD process 118 are performed in the same ALD apparatus 200 in accordance with some embodiments. That is, substrate 102 will not be exposed to moisture and oxygen in the air during the formation of first passivation layer 108, dielectric layer 112, and second passivation layer 116. Therefore, the formation of an interfacial layer, which may result in increasing the risk of leakage and reducing the capacitance of the metal-insulator-metal structure, may be avoided. As a result, the performance and yield of forming the metal-insulator-metal structure, such as metal-insulator-metal structures 100 and 100', are improved.

In addition, first ALD process 110, second ALD process 114, and third ALD process 118 further include using $H_2/N_2$ plasma in accordance with some embodiments. $H_2/N_2$ plasma may be used to treat the top surface of the material layer (e.g. bottom electrode layer 106) and to remove the oxide layer formed during the transferring process.

Embodiments of a semiconductor structure and methods for forming the semiconductor structure are provided. The semiconductor structure includes a bottom electrode layer, a first passivation layer, a dielectric layer, a second passivation layer, and a top electrode layer. The first passivation layer is positioned between the bottom electrode layer and the dielectric layer, and the second passivation layer is formed between the dielectric layer and the top electrode layer. The first passivation layer and the second passivation layer are amorphous layers having smooth surface. Therefore, the adhesion of the dielectric layer can be improved, and the yield and reliability of forming the semiconductor structure can be improved.

In some embodiments, a method for manufacturing a semiconductor structure is provided. The method for manufacturing a semiconductor structure includes forming a bottom electrode layer over a substrate and forming a first passivation layer over the bottom electrode layer by a first atomic layer deposition process. The method for manufacturing a semiconductor structure further includes forming a dielectric layer over the first passivation layer by a second atomic layer deposition process and forming a second passivation layer over the dielectric layer by a third atomic layer deposition process. The method for manufacturing a semiconductor structure further includes forming a top electrode layer over the second passivation layer.

In some embodiments, a method for manufacturing a metal-insulator-metal structure is provided. The method for manufacturing a metal-insulator-metal structure includes forming a bottom electrode layer over a substrate and forming a first passivation layer over the bottom electrode layer in a first chamber of an apparatus. The method for manufacturing a metal-insulator-metal structure further includes forming a dielectric layer over the first passivation layer in a second chamber of the apparatus and forming a second passivation layer over the dielectric layer in the first chamber of the apparatus. The method for manufacturing a metal-insulator-metal structure further includes forming a top electrode layer over the second passivation layer.

In some embodiments, a metal-insulator-metal structure is provided. The metal-insulator-metal structure includes a bottom electrode layer formed over a substrate and a first passivation layer formed over the bottom electrode layer. The metal-insulator-metal structure further includes a dielectric layer formed over the first passivation layer and a second passivation layer formed over the dielectric layer. The metal-insulator-metal structure further includes a top electrode layer formed over the second passivation layer. In addition, the first passivation layer and the second passivation layer are amorphous layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
forming a bottom electrode layer over a substrate by a physical vapor deposition process;
forming a first passivation layer over the bottom electrode layer by a first atomic layer deposition process;
forming a dielectric layer over the first passivation layer by a second atomic layer deposition process;
forming a second passivation layer over the dielectric layer by a third atomic layer deposition process;
forming a top electrode layer over the second passivation layer;
patterning the top electrode layer and the second passivation layer to have a first width; and
patterning the dielectric layer, the first passivation layer, and the bottom electrode layer to have a second width, wherein the second width is greater than the first width,
wherein the bottom electrode layer and the first passivation layer are made of a same material, but the bottom electrode layer is a crystalline layer and the first passivation layer is an amorphous layer.

2. The method for manufacturing a semiconductor structure as claimed in claim 1, wherein the top electrode layer is formed by a physical vapor deposition (PVD) process.

3. The method for manufacturing a semiconductor structure as claimed in claim 1, wherein the first atomic layer deposition process, the second atomic layer deposition process, and the third atomic layer deposition process, which are respectively used to form the first passivation layer, the dielectric layer, and the second passivation layer, are performed in the same apparatus.

4. The method for manufacturing a semiconductor structure as claimed in claim 1, wherein the first atomic layer deposition process comprises using $H_2/N_2$ plasma.

5. The method for manufacturing a semiconductor structure as claimed in claim 1, wherein the second passivation layer is an amorphous layer, and the top electrode layer is a crystalline layer.

6. The method for manufacturing a semiconductor structure as claimed in claim 1, wherein the first passivation layer is made of TiN or TaN.

7. The method for manufacturing a semiconductor structure as claimed in claim 1, wherein the first passivation layer has a thickness in a range from about 15 Å to about 50 Å.

8. A method for manufacturing a metal-insulator-metal structure, comprising:
forming a bottom electrode layer over a substrate;
forming a first passivation layer over the bottom electrode layer in a first chamber of an apparatus;
forming a dielectric layer over the first passivation layer in a second chamber of the apparatus;
forming a second passivation layer over the dielectric layer in the first chamber of the apparatus; and
forming a top electrode layer over the second passivation layer,
wherein the bottom electrode layer and the first passivation layer are made of a same material with different molecular arrangements.

9. The method for manufacturing a metal-insulator-metal structure as claimed in claim 8, wherein the bottom electrode layer and the top electrode layer are formed by physical vapor deposition (PVD) processes.

10. The method for manufacturing a metal-insulator-metal structure as claimed in claim 8, wherein $H_2/N_2$ plasma is applied into the first chamber of an atomic layer deposition apparatus when the first passivation layer and the second passivation layer are formed.

11. The method for manufacturing a metal-insulator-metal structure as claimed in claim 8, wherein the first passivation layer and the second passivation layer are amorphous layers, and the top electrode layer and the bottom electrode layer are crystalline layers.

12. The method for manufacturing a metal-insulator-metal structure as claimed in claim 8, wherein the first passivation layer is made of TiN or TaN.

13. The method for manufacturing a metal-insulator-metal structure as claimed in claim 8, wherein the first passivation layer has a thickness in a range from about 15 Å to about 50 Å.

14. A metal-insulator-metal structure, comprising:
a bottom electrode layer formed over a substrate;
a first passivation layer formed over the bottom electrode layer;
a dielectric layer formed over the first passivation layer;
a second passivation layer formed over the dielectric layer; and
a top electrode layer formed over the second passivation layer,
wherein the first passivation layer and the second passivation layer are amorphous layers, and the bottom electrode layer and the first passivation layer are made of a same material with different molecular arrangements,
wherein the top electrode layer and the second passivation layer have a first width, and
wherein the dielectric layer, the first passivation layer, and the bottom electrode layer have a second width which is greater than the first width.

15. The metal-insulator-metal structure as claimed in claim 14, wherein the first passivation layer is made of TaN or TiN.

16. The metal-insulator-metal structure as claimed in claim 14, wherein the first passivation layer has a thickness in a range from about 15 Å to about 50 Å.

17. The metal-insulator-metal structure as claimed in claim 14, wherein the top electrode layer and the bottom electrode layer are crystalline layers.

18. The method for manufacturing a metal-insulator-metal structure as claimed in claim 1, wherein the bottom electrode layer has a rough top surface and the first passivation layer has a smooth top surface.

19. The method for manufacturing a metal-insulator-metal structure as claimed in claim 8, further comprising:
patterning the top electrode layer and the second passivation layer to have a first width; and
patterning the dielectric layer, the first passivation layer, and the bottom electrode layer to have a second width, wherein the second width is greater than the first width.

20. The metal-insulator-metal structure as claimed in claim 14, wherein a roughness of the bottom electrode layer is greater than a roughness of the first passivation layer.

* * * * *